United States Patent [19]

Rohrer

[11] 4,195,355

[45] Mar. 25, 1980

[54] PROCESS FOR MANUFACTURING A FERROELECTRIC DEVICE AND DEVICES MANUFACTURED THEREBY

[75] Inventor: George A. Rohrer, Sault Ste. Marie, Mich.

[73] Assignee: Technovation, Inc., Sault Ste. Marie, Mich.

[21] Appl. No.: 658,199

[22] Filed: Feb. 17, 1976

Related U.S. Application Data

[63] Continuation-in-part of Ser. No. 316,417, Dec. 18, 1972, Pat. No. 3,939,292, which is a continuation-in-part of Ser. No. 76,059, Sep. 28, 1970, Pat. No. 3,728,694.

[51] Int. Cl.$^2$ .................... G11C 11/22; B05D 5/12
[52] U.S. Cl. ..................... 365/145; 427/58; 427/100; 427/125; 427/126; 427/248.1; 427/255.7; 427/250; 427/261; 427/309; 427/314; 427/380; 427/383.3; 427/404; 427/419.3; 427/419.4
[58] Field of Search .............. 427/100, 125, 126, 58, 427/372 A, 372 R, 261, 250, 248 R, 248 J, 383 A, 404, 419 B, 419 C, 309, 314, 380; 365/145; 134/28, 30; 207/192 E; 156/643, 651

[56] References Cited

U.S. PATENT DOCUMENTS

| | | | |
|---|---|---|---|
| 3,381,256 | 4/1968 | Schuller et al. | 427/103 |
| 3,405,440 | 10/1968 | Nolta et al. | 427/100 |
| 3,607,386 | 9/1971 | Galla et al. | 427/103 |
| 3,877,982 | 4/1975 | Coldren et al. | 427/100 |
| 3,939,292 | 2/1976 | Rohrer | 427/100 |

*Primary Examiner*—Michael F. Esposito
*Attorney, Agent, or Firm*—Irving M. Weiner; Pamela S. Burt; Melvin Yedlin

[57] ABSTRACT

A process for manufacturing a ferroelectric device includes the steps of chemically cleaning a substrate, followed by radio frequency etching of the substrate. The substrate is then pre-heated. A first electrical contact is then formed on the substrate, and over a portion of the first electrical contact there is vapor deposited a stable thin film of potassium nitrate. Then a second electrical contact is formed over at least a part of the thin film of potassium nitrate. A covering of silicon monoxide is then vacuum deposited over the assemblage of the first and second electrical contacts and the potassium nitrate. The assemblage is then annealed for approximately twenty-four hours at a temperature of approximately 160° C.

18 Claims, No Drawings

PROCESS FOR MANUFACTURING A FERROELECTRIC DEVICE AND DEVICES MANUFACTURED THEREBY

The present application is a continuation-in-part of copending U.S. patent application Ser. No. 316,417, filed Dec. 18, 1972 and entitled "PROCESS FOR STABLE PHASE III POTASSIUM NITRATE AND ARTICLES PREPARED THEREFROM" which issued as U.S. Pat. No. 3,939,292 on Feb. 17, 1976, which in turn is a continuation-in-part of U.S. patent application Ser. No. 76,059, filed Sept. 28, 1970 entitled "FERROELECTRIC DEVICE AND PROCESS OF MANUFACTURING SAME" which is now U.S. Pat. No. 3,728,694.

BACKGROUND OF THE INVENTION

The usable lifetime of ferroelectric devices whch include phase III potassium nitrate is determined by three parameters: (1) the phase III crystalline structure stability of the potassium nitrate; (2) the number of read/write cycles that can be accomplished before the output voltage is less than a predetermined usable level; and (3) the length of time a memory bit will retain information.

Phase III potassium nitrate in bulk material is an unstable phase at normal room temperature and pressure. The present invention involves the use of a stable thin film of potassium nitrate, and it is the processing parameters which determine the stability of the phase III configuration. The only accurate test to determine the long term stability of phase III potassium nitrate is in real time.

The art is exemplified by U.S. Pat. Nos. 3,483,447; 3,405,440; 3,213,027; 3,305,394; 2,916,681; 3,132,326; 3,460,103; 3,414,435; 3,728,694; 3,142,044; 3,728,694 and 3,939,292; Canadian Pat. No. 747,459; RCA Technical Notes TN No. 8223-17-69 "Reduction of Waiting Time Effects in Ferroelectrics" by George W. Taylor, pages 1–3; IEEE Proceedings of the Twentieth Electronic Components Conference, May 13–15, 1970 "Progress Toward a Fast, Non-Volatile, Non-Destructive Read Out Memory Element Utilizing KNO$_3$" by Richard C. Born et al, pages 149–154; 1970 Michigan Technological University Thesis "Progress on a Thin Film Potassium Nitrate Ferroelectric Memory" by George Andrew Rohrer; 1969 Proceedings of the Electrochemical Society entitled "Thin Film Dielectrics", edited by Frederick Vratny, pages 237–53; paper entitled "Dielectric Behavior of Films of Vacuum-Deposited KNO$_3$" by J. P. Nolta et al; 1971 Michigan Technological University Thesis entltled "Investigation of a Thin Film Ferroelectric Memory Device Utilizing KNO$_3$" by John W. Loney; and "A Proposed Fast-Access Large-Capacity Ferroelectric Memory", by D. W. Chapman, Systems Development Division, IBM Corporation, San Jose, California.

The present invention avoids the drawbacks and disadvantages of the prior art and is superior thereto on the basis of the above-mentioned three parameters.

SUMMARY OF THE INVENTION

In accordance with one aspect of the present invention there is provided a process for manufacturing a ferroelectric device which includes the steps of forming a first electrical contact, and thereafter forming, by vapor deposition performed in a vacuum at a pressure of no greater than $1 \times 10^{-5}$ Torr and at a temperature of from about 390° C. to 440° C., a stable thin film of potassium nitrate over at least a portion of the first electrical contact. The vacuum is then relieved to a pressure of approximately one atmosphere with a dry predetermined gas for a first predetermined period of time, and thereafter the vacuum is reapplied. There is then formed a second electrical contact over at least a portion of the stable thin film of potassium nitrate. Then there is vacuum deposited a covering of silicon monoxide over the first electrical contact, the thin film of potassium nitrate, and the second electrical contact. The assemblage with its covering of silicon monoxide is then heated for a second predetermined period of time at a predetermined temperature.

In accordance with a preferred embodiment of the invention, there is provided a process of manufacturing a ferroelectric device which includes the steps of chemically cleaning a substrate, and then radio frequency etching such substrate. The substrate is then preheated and thereafter there is vacuum deposited thereon a first metallic layer. This is followed by the vacuum deposition thereon of a thin film of potassium nitrate. Then there is vacuum deposited on top of the potassium nitrate a second metallic layer. This is followed by the vacuum deposition thereon of the silicon monoxide covering. The assemblage is then annealed in an oven for approximately twenty-four hours at a temperature of approximately 160° C.

The present invention also provides a ferroelectric device manufactured in accordance with the novel processes described herein.

It is an object of the present invention to provide a ferroelectric device and a process of manufacturing same which will exceed the number of read/write cycles presently guaranteed by manufacturers in this area of technology.

It is a further object of the present invention to provide processes for manufacturing ferroelectric devices, and devices manufactured thereby, which prevent the reversion of phase III potassium nitrate to phase II potassium nitrate.

Another object of the present invention is to provide a ferroelectric device which impedes the deliquescence of phase III potassium nitrate.

The foregoing objects and other objects and features of the present invention will become more apparent from the following description of some specific embodiments which are given by way of example and illustration, but not of limitation.

DETAILED DESCRIPTON OF PREFERRED EMBODIMENTS

There is hereby incorporated by reference thereto the entire disclosures of the aforementioned U.S. patent applications Ser. Nos. 76,059 (now U.S. Pat. No. 3,728,694) and 316,417 (now U.S. Pat. No. 3,939,292).

In accordance with a preferred embodiment of the present invention, the novel process for manufacturing a ferroelectric device comprises the steps of forming a first electrical contact, of a suitable metallic substance, such as aluminum, silver, gold, etc. Then there is formed, by vapor deposition performed in a vacuum at a pressure no greater than $1 \times 10^{-5}$ Torr and at a temperature of from about 390° C. to 440° C., a stable thin film of potassium nitrate over at least a portion of the first electrical contact. Then the vacuum is relieved to a pressure of approximately one atmosphere with a dry predetermined gas for a first predetermined period of time, and thereafter the vacuum is reapplied. There is then formed a second electrical contact, of any of the metallic substances mentioned hereinabove, over at least a portion of the stable thin film of potassium nitrate. Then there is vacuum deposited a covering of silicon monoxide over the first electrical contact, the thin film of potassium nitrate, and the second electrical contact. Then the assemblage of the first and second electrical contacts, the thin film potassium nitrate, and the silicon monoxide covering is heated for a second predetermined period of time at a predetermined temperature. This results in a product which is superior to any heretofore manufactured.

Thin film phase III potassium nitrate is very deliquescent. When exposed to normal room environment, the phase III crystalline structure has a tendency to revert to phase II because of this deliquescence.

According to the present invention, when the device is fabricated, a passivation layer of silicon monoxide is deposited thereover to protect the potassium nitrate from the external environment. As an optional step, when the device is packaged, it may also be further covered with a silicon gel for further environmental protection.

As an actual example of a working device produced in accorance with the aforementioned technique, a packaged memory, which consisted of a glass-covered twenty-eight-pin ceramic ferroelectric device, was inserted into a pint of water and let set therein for approximately seventy-two hours. The device was checked every four hours, and at the end of seventy-two hours the ferroelectric device was still fully functional. The device was then stored on a shelf and checked a week later, and still was fully functional. This test was repeated three times with consistent results.

In accordance with another embodiment of the novel process, a substrate is first chemically cleaned, and thereafter radio frequency etched. The substrate is then preheated to approximately 160° C. Thereafter there is vacuum deposited a first layer of an electrical contact, such as aluminum, gold, silver, etc. This assemblage is then heated at a temperature of approximately 160° C. for approximately fifteen minutes.

Then there is vacuum deposited thereon the thin film of potassium nitrate, and this assemblage is then heated to approximately 160° C. for approximately fifteen minutes.

There is then vacuum deposited over the assemblage a silicon monoxide covering. Optionally there is then put on a silicon jelly, and then the assemblage is heated for approximately twenty-four hours at a temperature of 160° C.

As an alternative to the foregoing, it is not necessary to use a heating step after each one of the aforementioned steps, but merely the final heating step mentioned above may be employed in the alternative process.

It is also a feature of the present invention to keep the stable thin film layer of potassium nitrate to a thickness no greater than 1500 Angstrom units.

The following Chart-A shows some exemplary samples of ferroelectric devices made in accordance with other aspects of the novel process.

CHART - "A"

| Step No. |  | A-I | A-II | B-I | B-II | C-I | C-II |
|---|---|---|---|---|---|---|---|
| 1. | Material: | gold | gold | gold | gold | gold | gold |
|  | Deposition Time: | 2:40 | 2:00 | 1:20 | 1:15 | 1:10 | 1:00 |
|  | Monitor Thickness: | 150 | 150 | 150 | 150 | 150 | 150 |
| 2. | Material: | $KNO_3$ | $KNO_3$ | $KNO_3$ | $KNO_3$ | $KNO_3$ | $KNO_3$ |
|  | Deposition Time: | 15:00 | 15:00 | 18:00 | 15:00 | 15:00 | 10:00 |
|  | Monitor Thickness: | 400 | 400 | 700 | 700 | 1000 | 1000 |
| 3. | Material: | gold | gold | gold | gold | gold | gold |
|  | Deposition Time: | 1:40 | 1:50 | 1:00 | 1:10 | 1:20 | 1:10 |
|  | Monitor Thickness: | 150 | 150 | 150 | 150 | 150 | 150 |
| 4. | Material: | SiO | SiO | SiO | SiO | SiO | SiO |
|  | Deposition Time: | 2:00 | 3:00 | 2:00 | 2:20 | 3:00 | 2:00 |
|  | Monitor Thickness: | 800 | 1000 | 800 | 1000 | 1000 | 800 |

With respect to Chart-A, the units for the deposition times are minutes, and the monitor thickness represents the set point thickness and density determined by a crystal thickness/rate monitor.

It has been surprisingly discovered that ferroelectric devices were obtained which can be successfully cycled from $10^8$ to $10^{10}$ cycles. This has been obtained primarily with gold electrodes, wherein the potassium nitrate thin film layer had a thickness of less than 1500 Angstroms, and preferably in the range of 600–800 Angstrom units. It has also been found that it is only necessary to heat or anneal for a period of fifteen minutes in a temperature of 180° C.–380° C., and preferably at approximately 180° C. after the application of the silicon monoxide covering, and prior to the bonding and application of the gel material. It has also been found preferable to keep the thickness of the gold electrodes to approximately 150 Angstrom units.

At this point it should be borne in mind that the above-mentioned second parameter which determines useful life time is the amount of times a ferroelectric cell can be written, read destructively, and repeated, or, the total number of read/write cycles. With the present invention, the number of read/write cycles has been improved to at least $10^8$. Experimentation with the process parameters has resulted in ferroelectric cells which have been cycled at 850 kilohertz for $10^{10}$ cycles with all output retaining its original value, i.e., plus or minus five percent. This is quite surprising and significant when it is remembered that nitride memory manufacturers in the industry will only guarantee $10^6$ to $10^7$ read/write cycle life time. In particular, ferroelectric devices made in accordance with the process of the present invention have been switched at a rep rate of 833,333 hertz for 12,026 seconds. This represents a total of $1.002 \times 10^{10}$ cycles.

It should also be borne in mind that, unlike nitride memories, retention time for the ferroelectric devices produced in accordance with the present invention is not a function of write time. Read and write times are symmetrical for the ferroelectric devices produced in accordance with the present invention.

It has also been surprisingly discovered that ferroelectric devices produced in accordance with the present invention are radiation hard. In particular, such devices have been subjected to a radiation of $10^7$ gamma and have still functioned normally and retained data. In such tests, the ferroelectric device was positioned adjacent to the gamma source. This is quite significant and surprising in that bipolar devices are destroyed at $10^6$ gamma, whereas other memory devices on the market are destroyed by $10^5$ gamma or less.

It is to be understood that the invention is not limited in its application or features to the details of construction and process steps as set forth hereinabove in connection with the particular preferred embodiments described. This is so because the invention is capable of other embodiments and of being practiced or carried out in various ways. Also, it is to be understood that the phraseology or terminology employed herein is for the purpose of description and not of limitation.

The above description will make the features of the present invention apparent. For a definition of the scope of the invention, reference should be had to the appended claims.

I claim:

1. A process for manufacturing a ferroelectric device, comprising the steps of:
    forming a first electrical contact;
    forming, by vapor deposition performed in a vacuum at a pressure no greater than $1 \times 10^{-5}$ Torr and at a temperature of from about 390° C. to 440° C., a stable thin film of potassium nitrate over at least a portion of said first electrical contact;
    relieving said vacuum to a pressure of approximately one atmosphere with a dry predetermined gas for a first predetermined period of time;
    reapplying said vacuum;
    forming a second electrical contact over at least a portion of said stable thin film of potassium nitrate;
    vacuum depositing a covering of silicon monoxide over said first electrical contact, said thin film of potassium nitrate, and said second electrical contact; and
    heating said first and second electrical contacts, said thin film of potassium nitrate, and said covering of silicon monoxide for a second predetermined period of time and at a predetermined temperature.

2. A process according to claim 1, wherein:
    said second predetermined period of time is no less than 15 minutes; and
    said predetermined temperature falls within the range of approximately 100° C. through 300° C.

3. A process according to claim 1, wherein said first and second electrical contacts are formed from gold.

4. A process according to claim 1, wherein:
    said stable thin film of potassium nitrate is vapor deposited to a thickness no greater than 1500 Angstrom units.

5. A process according to claim 1, wherein:
    said thin film of potassium nitrate is vapor deposited to a thickness falling in the range of approximately 600 Angstrom units through 800 Angstrom units.

6. A process according to claim 1, including:
    the step of covering the ferroelectric device with a silicon gel when said device is packaged.

7. A process according to claim 5, wherein:
    said first and second electrical contacts are formed from gold and each have a thickness of approximately 150 Angstrom units.

8. A process according to claim 1, including:
    prior to forming said first electrical contact, a substrate is first chemically cleaned, radio frequency etched, and preheated before said first electrical contact is vacuum deposited on said substrate.

9. A process according to claim 1, including:
    at least one additional heating step is performed in the process after said first electrical contact is formed, and prior to the vacuum deposition of said covering of silicon monoxide.

10. A ferroelectric device manufactured in accordance with the process of claim 1.

11. A ferroelectric device manufactured in accordance with the process of claim 2.

12. A ferroelectric device manufactured in accordance with the process of claim 3.

13. A ferroelectric device manufactured in accordance with the process of claim 4.

14. A ferroelectric device manufactured in accordance with the process of claim 5.

15. A ferroelectric device manufactured in accordance with the process of claim 6.

16. A ferroelectric device manufactured in accordance with the process of claim 7.

17. A ferroelectric device manufactured in accordance with the process of claim 8.

18. A ferroelectric device manufactured in accordance with the process of claim 9.